(12) United States Patent
Tsai et al.

(10) Patent No.: US 7,787,255 B2
(45) Date of Patent: Aug. 31, 2010

(54) GROUNDING APPARATUS OF PORTABLE ELECTRONIC DEVICES

(75) Inventors: Ching-Sen Tsai, Tu-Cheng (TW);
Mei-Tsu Tsao, Tu-Cheng (TW);
Cheng-Lung Chang, Tu-Cheng (TW)

(73) Assignee: Chi Mei Communication Systems, Inc., Tu-Cheng, Taipei County (TW)

( * ) Notice: Subject to any disclaimer, the term of this patent is extended or adjusted under 35 U.S.C. 154(b) by 476 days.

(21) Appl. No.: 11/948,547

(22) Filed: Nov. 30, 2007

(65) Prior Publication Data

US 2009/0015993 A1 Jan. 15, 2009

(30) Foreign Application Priority Data

Jul. 13, 2007 (CN) .......................... 2007 1 0076018

(51) Int. Cl.
*H05K 9/00* (2006.01)
(52) U.S. Cl. .................. 361/753; 361/799; 361/800; 361/816; 361/818; 174/350; 174/377
(58) Field of Classification Search .................. 361/730, 361/749, 752, 753, 799, 800, 816, 818; 174/350, 174/377, 254
See application file for complete search history.

(56) References Cited

U.S. PATENT DOCUMENTS

| | | | | | |
|---|---|---|---|---|---|
| 5,805,251 | A | * | 9/1998 | Ozawa | 349/110 |
| 5,990,989 | A | * | 11/1999 | Ozawa | 349/61 |
| 6,031,732 | A | * | 2/2000 | Koike et al. | 361/816 |
| 6,172,881 | B1 | * | 1/2001 | Hirai | 361/816 |
| 6,307,743 | B1 | * | 10/2001 | Aizawa et al. | 361/752 |
| 6,462,958 | B2 | * | 10/2002 | Ogata | 361/800 |
| 6,480,397 | B1 | * | 11/2002 | Hsu et al. | 361/814 |
| 6,587,419 | B1 | * | 7/2003 | Aizawa et al. | 720/650 |
| 7,177,161 | B2 | * | 2/2007 | Shima | 361/816 |
| 2004/0057218 | A1 | * | 3/2004 | Wu et al. | 361/753 |

* cited by examiner

*Primary Examiner*—Dameon E Levi
(74) *Attorney, Agent, or Firm*—Jeffrey T. Knapp

(57) ABSTRACT

A grounding apparatus (200) includes at least one conductive member (20), a sliding mechanism (30) and a flexible printed circuit board (40). The sliding mechanism is conductive and electrically connected to the conductive member. The flexible printed circuit board includes a conductive layer (421) and a grounding end (4231), the conductive layer and the grounding end are electrically connected to the sliding mechanism.

14 Claims, 13 Drawing Sheets

GROUNDING APPARATUS OF PORTABLE ELECTRONIC DEVICES

BACKGROUND OF THE INVENTION

1. Field of the Invention

The present invention relates to grounding apparatuses, and, particularly, to a grounding apparatus of a portable electronic device with a sliding mechanism.

2. Description of Related Art

Sliding cover mechanisms are widely used in portable electronic devices such as mobile phones, laptops and personal digital assistants (PDAs). Generally, such portable electronic device includes a base, a cover and a sliding apparatus, and the cover is slidingly mounted on the base via the sliding apparatus. The cover includes a liquid crystal module (LCM), and the base includes a circuit board. The liquid crystal module is electrically connected to the circuit board via a flexible printed circuit board (FPC).

When the aforementioned portable electronic device is used, it may be damaged by a high electrostatic discharge (ESD). For example, when walking on a carpet floor, a person can easily acquires static charge with high electrostatic. The static charge is likely to cause an instantaneous discharging between the body of the person and the portable electronic device. Thus, the discharging could possibly create an electrical current significantly enough to cause damages to the circuit of the portable electronic device. Therefore, it is necessary to prevent the circuit of the portable electronic device to from being damaged by electrostatic discharge.

In use of the aforementioned portable electronic device with a sliding cover mechanism, a typical method to prevent the circuit from being damaged by electrostatic discharge is directly connecting the flexible printed circuit board to a grounding plane to conduct the electrostatic charges. However, the flexible printed circuit board usually does not have the ability to conduct an electrostatic discharge higher than a thousand volts.

Therefore, a new grounding apparatus is desired in order to overcome the above-described shortcomings.

SUMMARY

A grounding apparatus includes at least one conductive member, a sliding mechanism and a flexible printed circuit board. The sliding mechanism is conductive and electrically connected to the conductive member. The flexible printed circuit board includes a conductive layer and a grounding end, the conductive layer and the grounding end are electrically connected to the sliding mechanism.

Other advantages and novel features will become more apparent from the following detailed description when taken in conjunction with the accompanying drawings.

BRIEF DESCRIPTION OF THE DRAWINGS

Many aspects of the present grounding apparatus can be better understood with reference to the following drawings. The components in the various drawings are not necessarily drawn to scale, the emphasis instead being placed upon clearly illustrating the principles of the present grounding apparatus. Moreover, in the drawings, like reference numerals designate corresponding parts throughout the figures.

DETAILED DESCRIPTION OF THE EMBODIMENT

Figure 1:
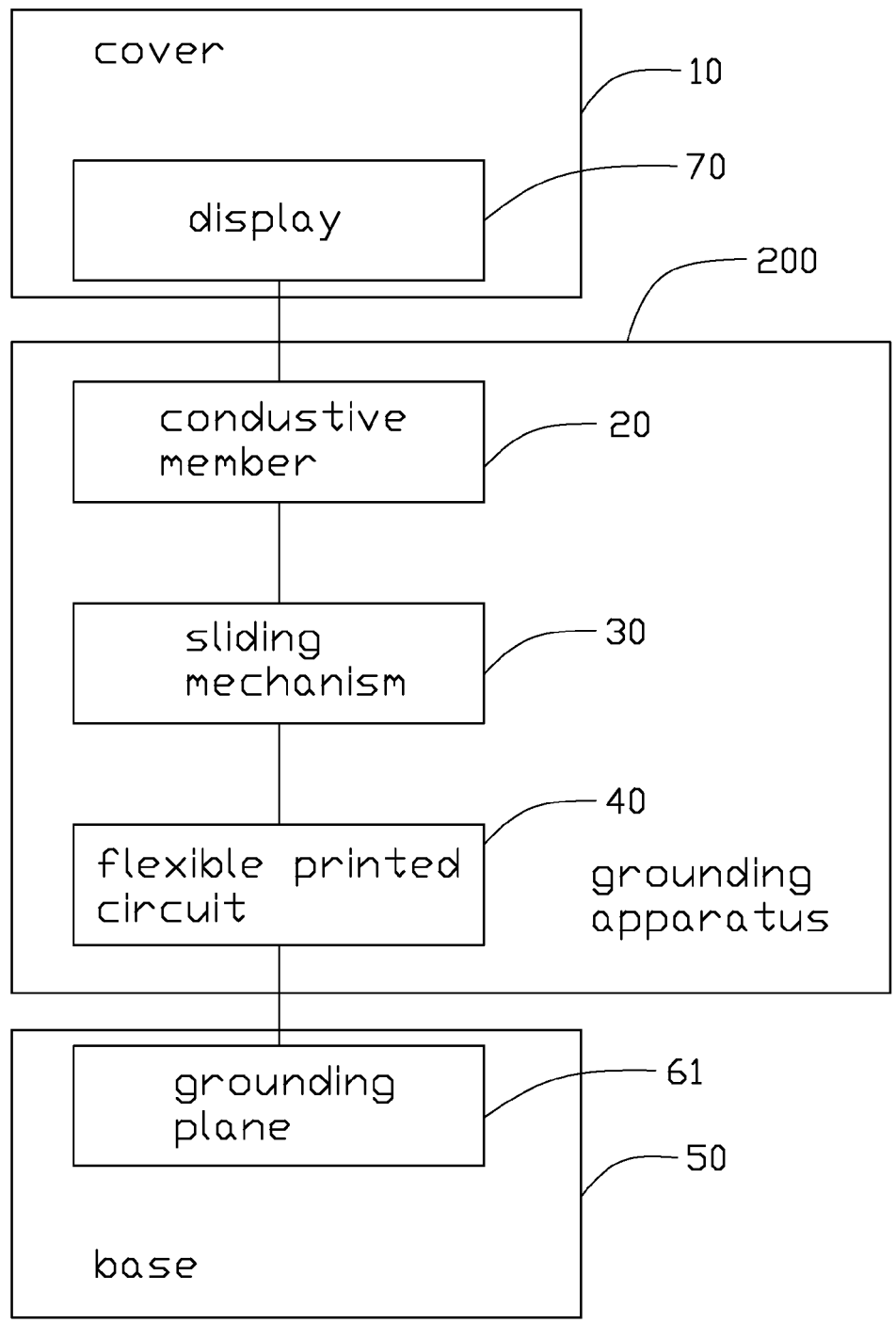
FIG. 1 is a diagram of electronic connection of the grounding apparatus in accordance with a present embodiment.
Figure 2:
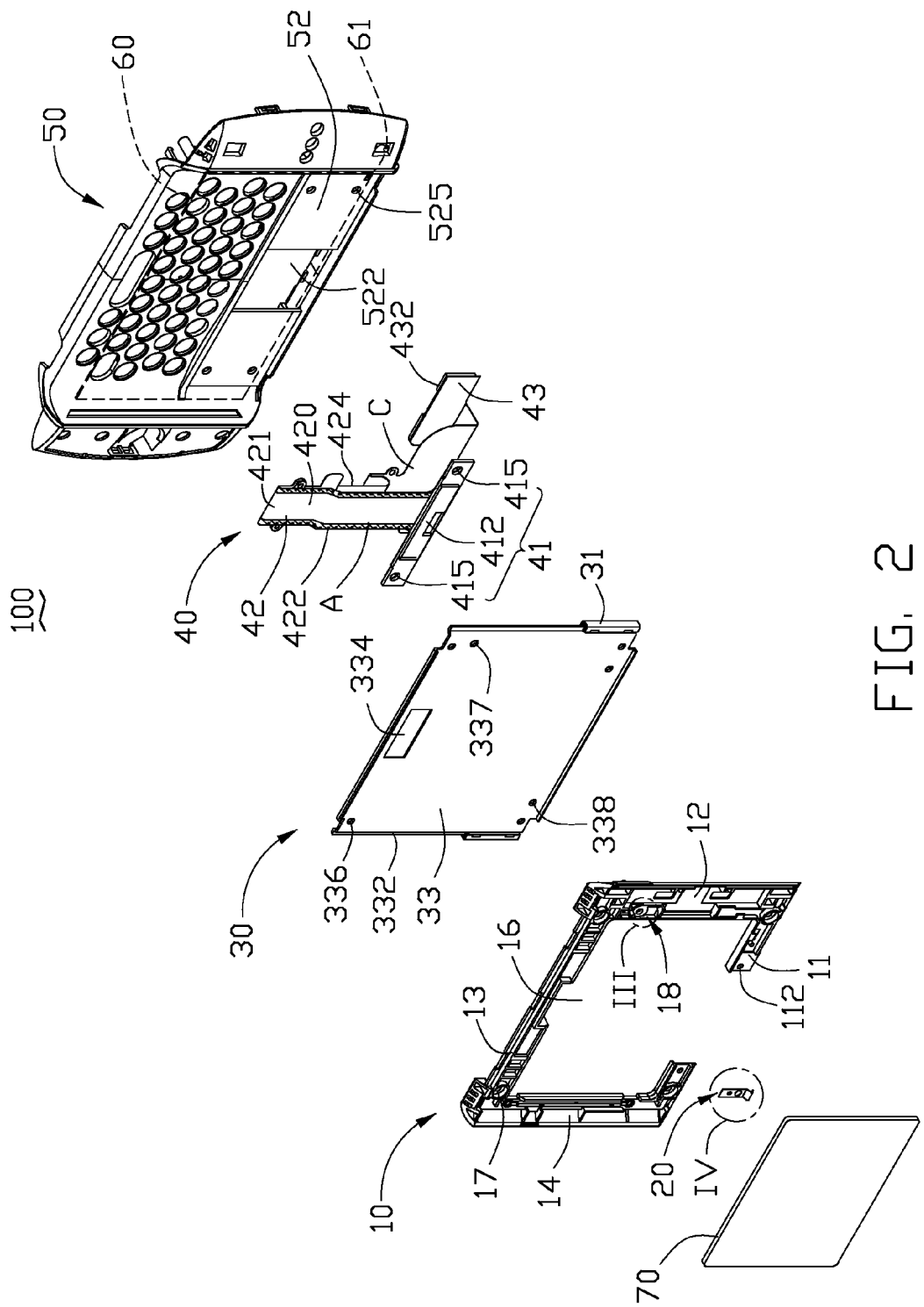
FIG. 2 is a partly disassembled view of a portable electronic device with the grounding apparatus shown in FIG. 1.
Figure 3:
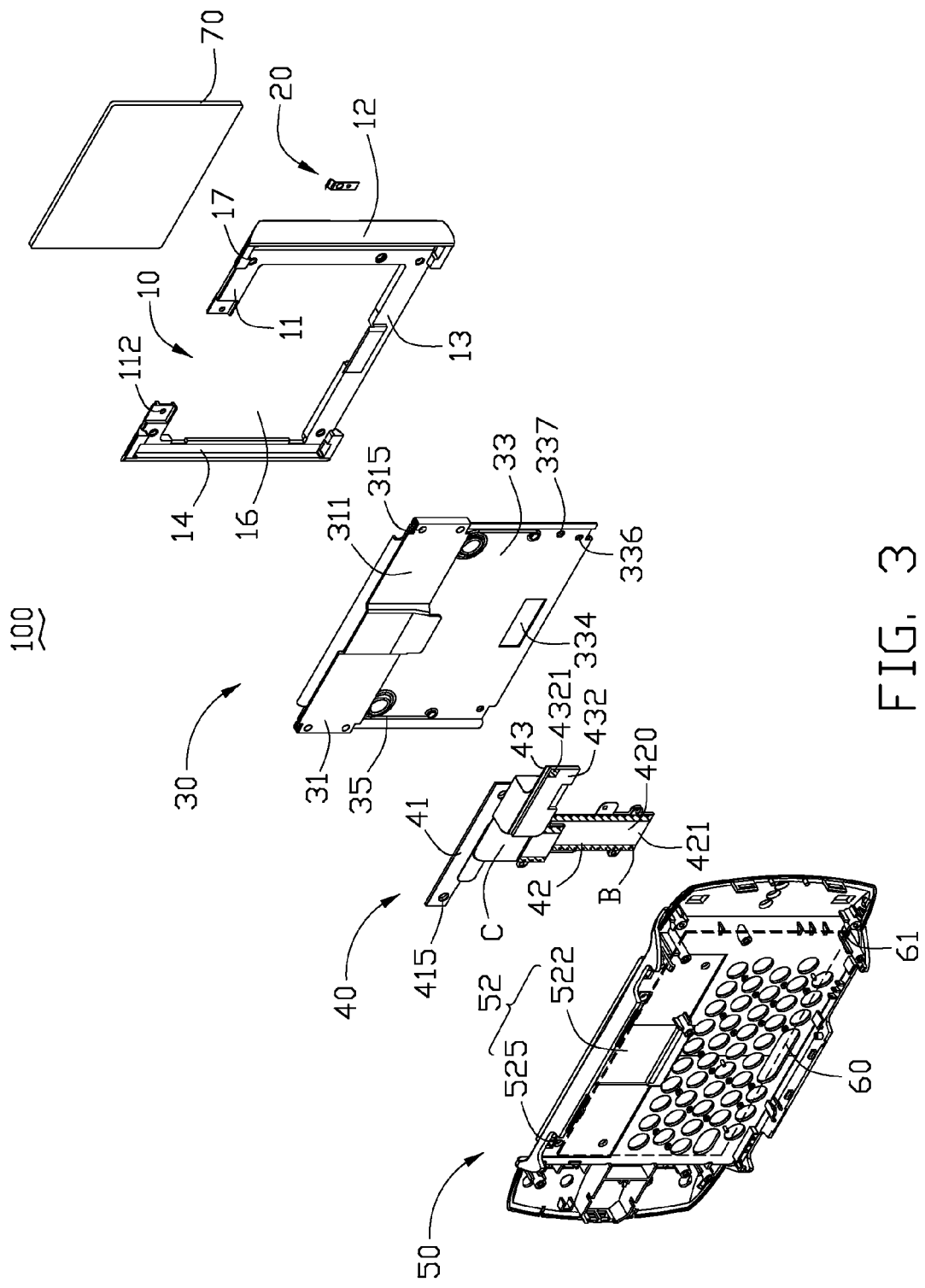
FIG. 3 is similar to FIG. 2, but shown in a second visual angle.

Referring to FIG. 1, FIG. 2 and FIG. 3, a grounding apparatus 200 in accordance with a present embodiment is provided. The grounding apparatus 200 is mounted in a portable electronic device 100 and includes at least one conductive member 20, a sliding mechanism 30 and a flexible printed circuit board 40.

The portable electronic device 100 can be a mobile phone or a personal digital assistant (PDA), etc. The portable electronic device 100 includes a cover 10 and a base 50. The cover 10 is slidably mounted on the base 50 via the sliding member 30.

The cover 10 is approximately a rectangular frame and includes four sides 11, 12, 13 and 14. The four sides 11, 12, 13 and 14 incorporate as a displaying window 16 configured for mounting a display of the portable electronic device 100 therein. The cover 10 defines a first retaining hole 17 at each corner for connecting the cover 10 and the sliding mechanism 30 together. The side 11 is cut off in its middle portion, thus forming a gap (not labeled). Two first mounting holes 112 are respectively defined in two ends adjacent to the gap of the side 11 for mounting the flexible printed circuit board 40. At least one mounting recess 18 is defined on the side 12 for mounting the conductive member 20.

Figure 4:
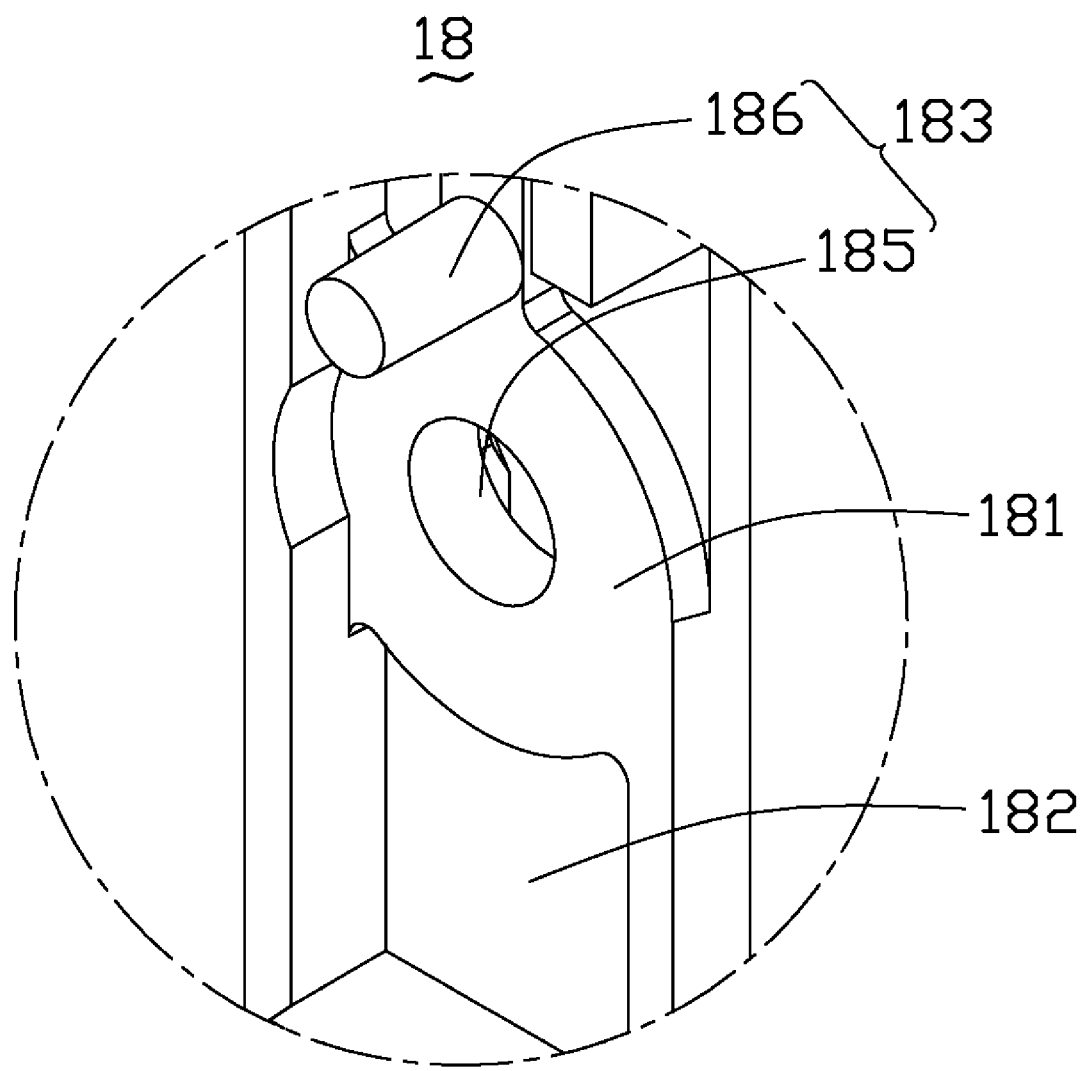
FIG. 4 is an enlarged view of the part III shown in FIG. 2.

Also referring to FIG. 4, a bottom 181 of the mounting recess 18 is formed on the side 12. A part of the bottom 181 recesses to form an approximately rectangular containing groove 182 therein. A retaining structure 183 is formed adjacent to the containing groove 182. The retaining structure 183 is formed by a first holding hole 185 and a holding pole 186. One round part of the bottom 181 adjacent to the containing groove 182 defines the first holding hole 185 with a shape of cylinder, and the holding pole 186 is formed adjacent to the first holding hole 185 and extends perpendicularly to the bottom 181.

Figure 5:
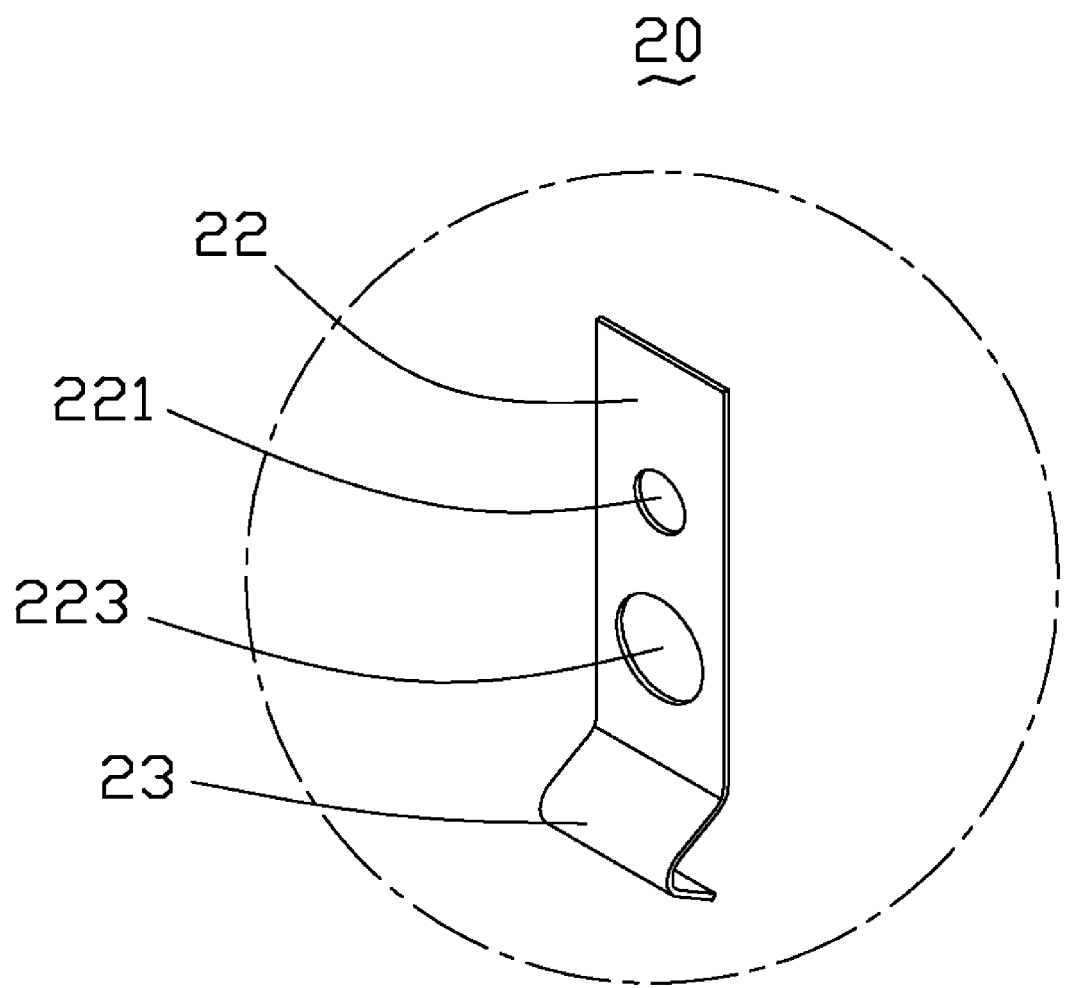
FIG. 5 is an enlarged view of the part IV shown in FIG. 2.

Also referring to FIG. 5, the conductive member 20 is an approximately rectangular board. The conductive member 20 includes an installing end 22 and a bent end 23. An inserting hole 221 and a second holding hole 223 are defined in the installing end 22. The inserting hole 221 corresponds to the holding pole 186. The bent end 23 bends to be V-shaped, and the bent end 23 is resilient.

Also referring to FIG. 2 and FIG. 3, the sliding mechanism 30 includes a static member 31, a sliding member 33 and two resilient members 35. The sliding member 33 is slidably mounted on the static member 31. The resilient members 35 are configured to resume the moved sliding member 33 to its initial position.

Figure 6:
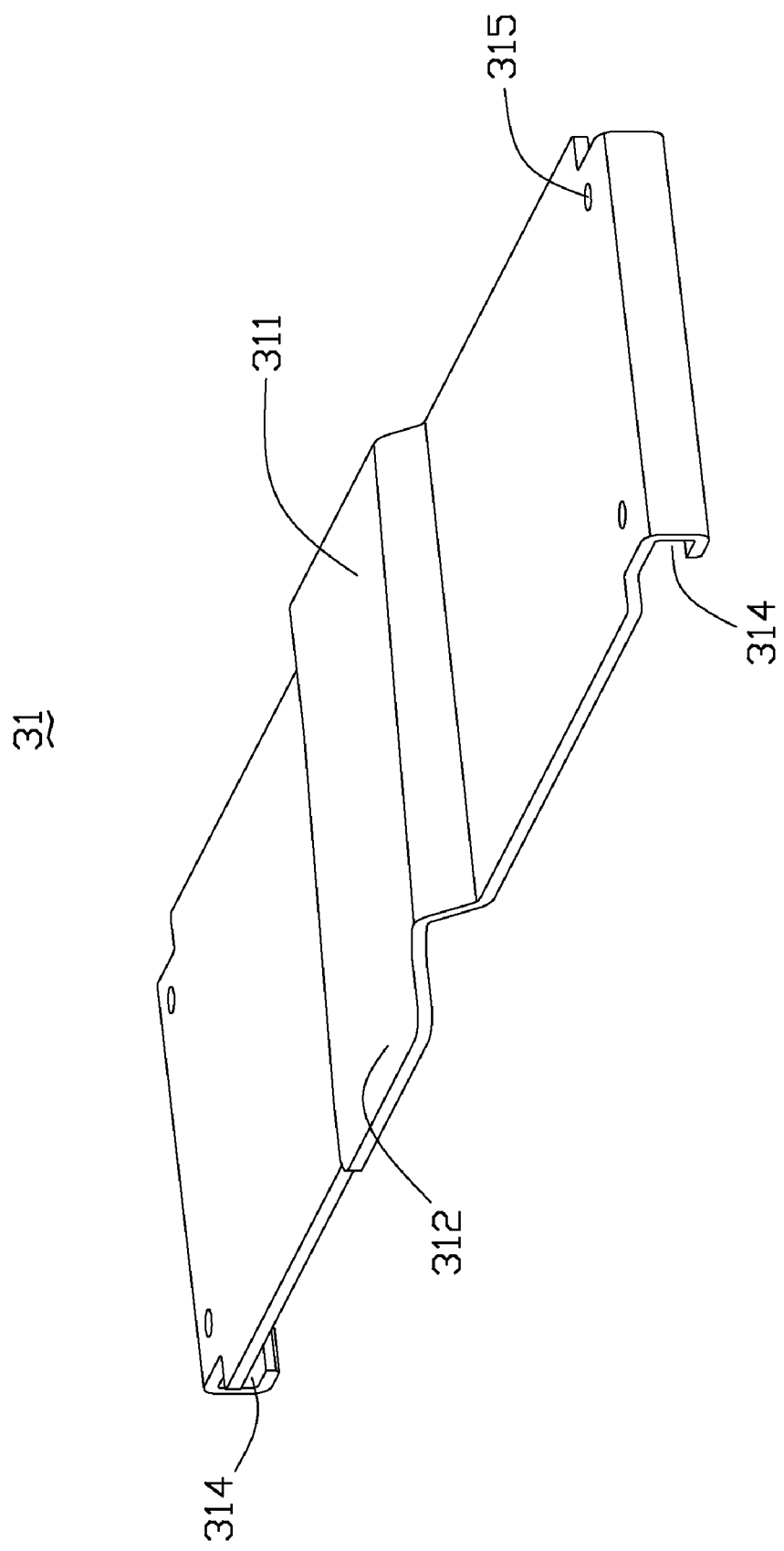
FIG. 6 is an enlarged, schematic view of a static member of a sliding cover mechanism of the portable electronic device shown in FIG. 2.

Also referring to FIG. 6, the static member 31 is approximately a rectangular board and made of conductive materials. A middle portion of the static member 31 bends to form an approximately U-shaped receiving portion 311. One side of the receiving portion 311 extends to form an approximately rectangular mounting portion 312. Two opposite sides of the static member 31 bend to be approximately U-shaped, thereby forming two sliding grooves 314 opposite to each other. The static member 31 also defines a first screw hole 315 in each corner thereof.

Figure 7:
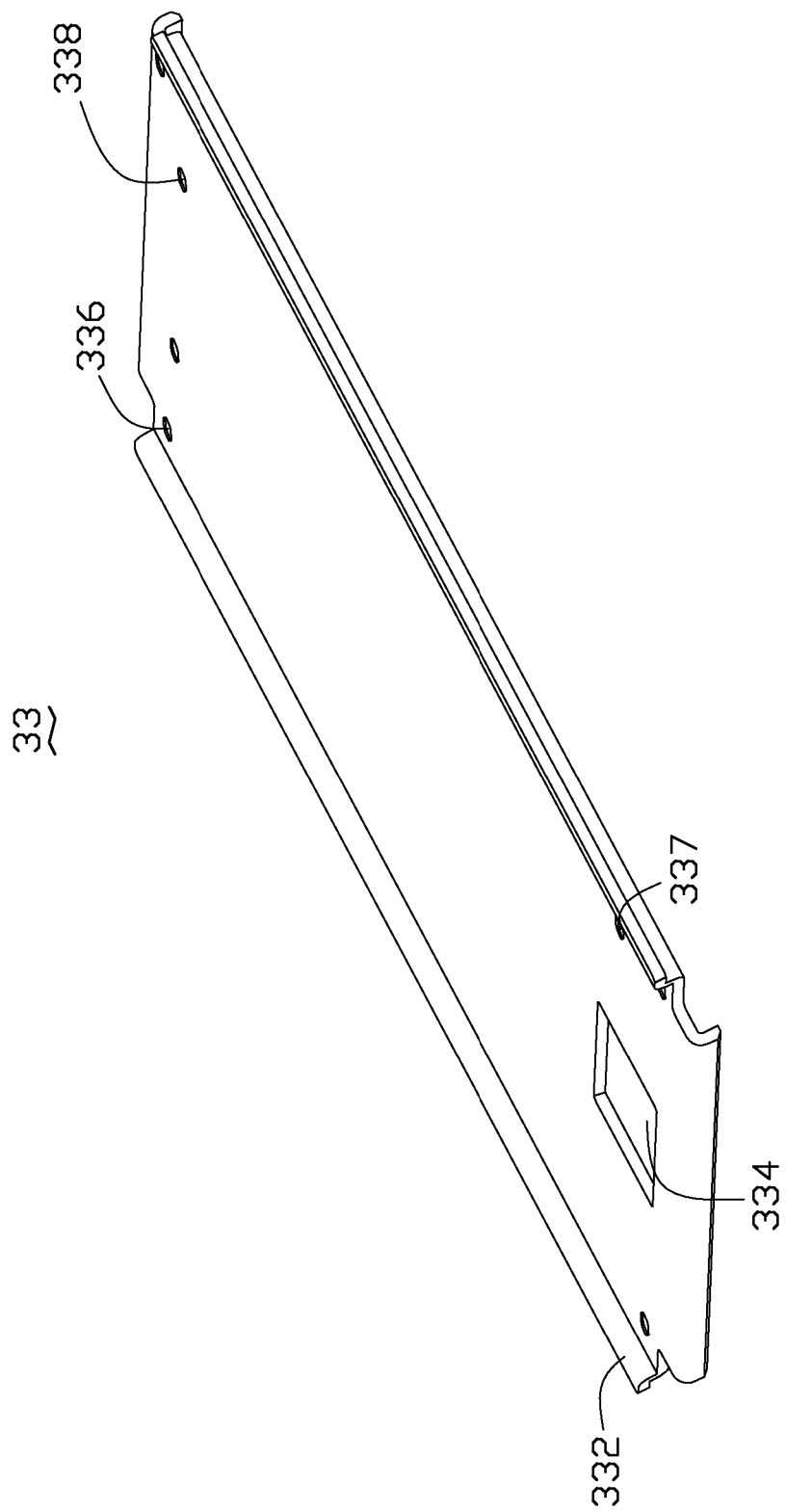
FIG. 7 is an enlarged, schematic view of a sliding member of the sliding cover mechanism of the portable electronic device shown in FIG. 2.

Also referring to FIG. 7, the sliding member 33 is an approximately rectangular board and made of conductive materials. Two opposite sides of the sliding member 33 bend to form two sliding rails 332 corresponding to the sliding grooves 314. Each sliding rail 332 movably engages with a corresponding sliding groove 314, particularly shown in FIG. 8. The sliding member 33 defines a rectangular locating hole 334 therein. The sliding member 33 also defines a plurality of second retaining holes 336 corresponding to the first retaining holes 17, a third holding hole 337 corresponding to the first holding hole 185 and the second holding hole 223, and a plurality of second mounting holes 338 corresponding to the first mounting holes 112 therein.

Figure 10:
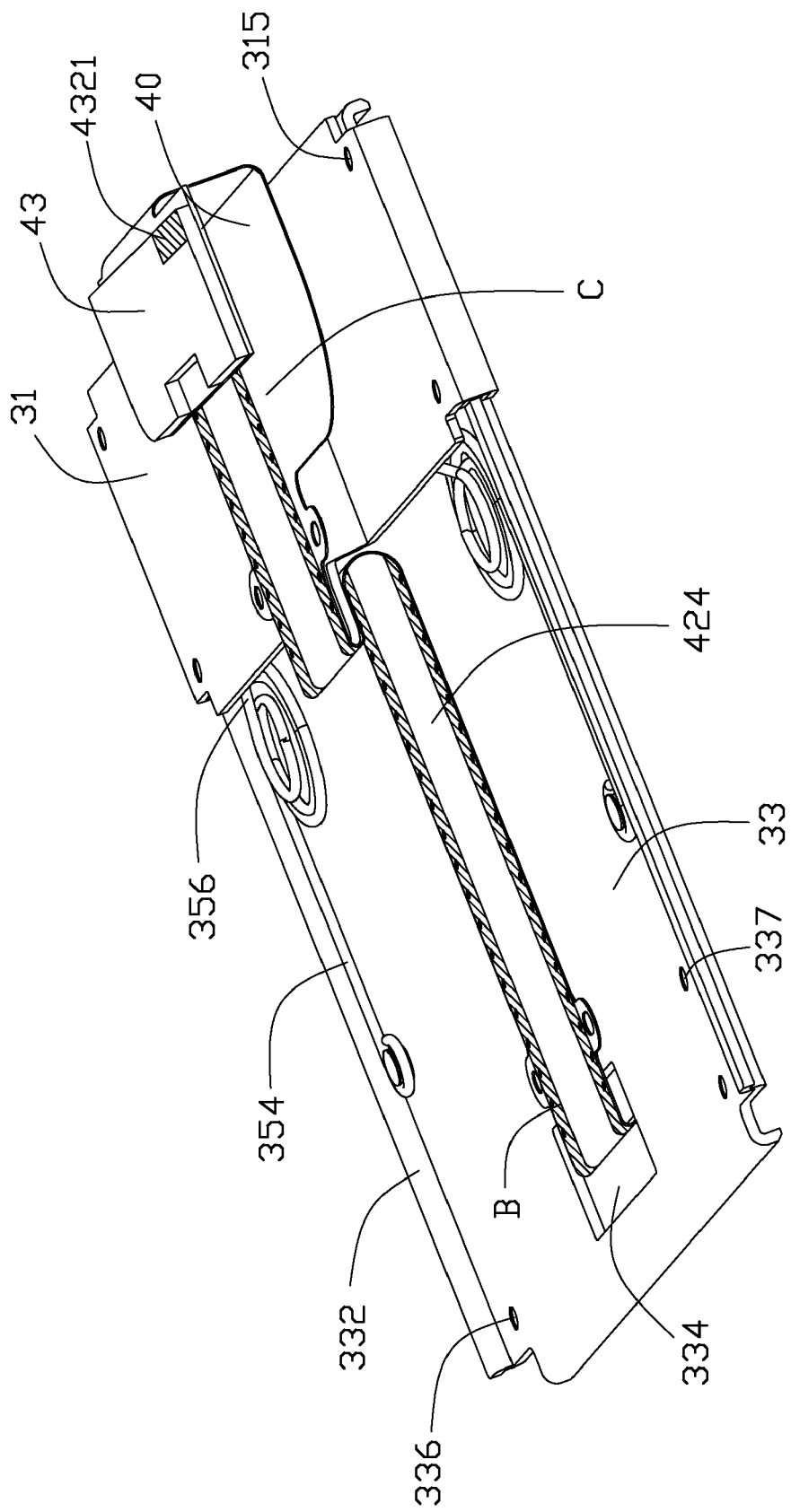
FIG. 10 is a closed, schematic view of the sliding cover mechanism and the flexible printed circuit board shown in FIG. 2.
Figure 11:
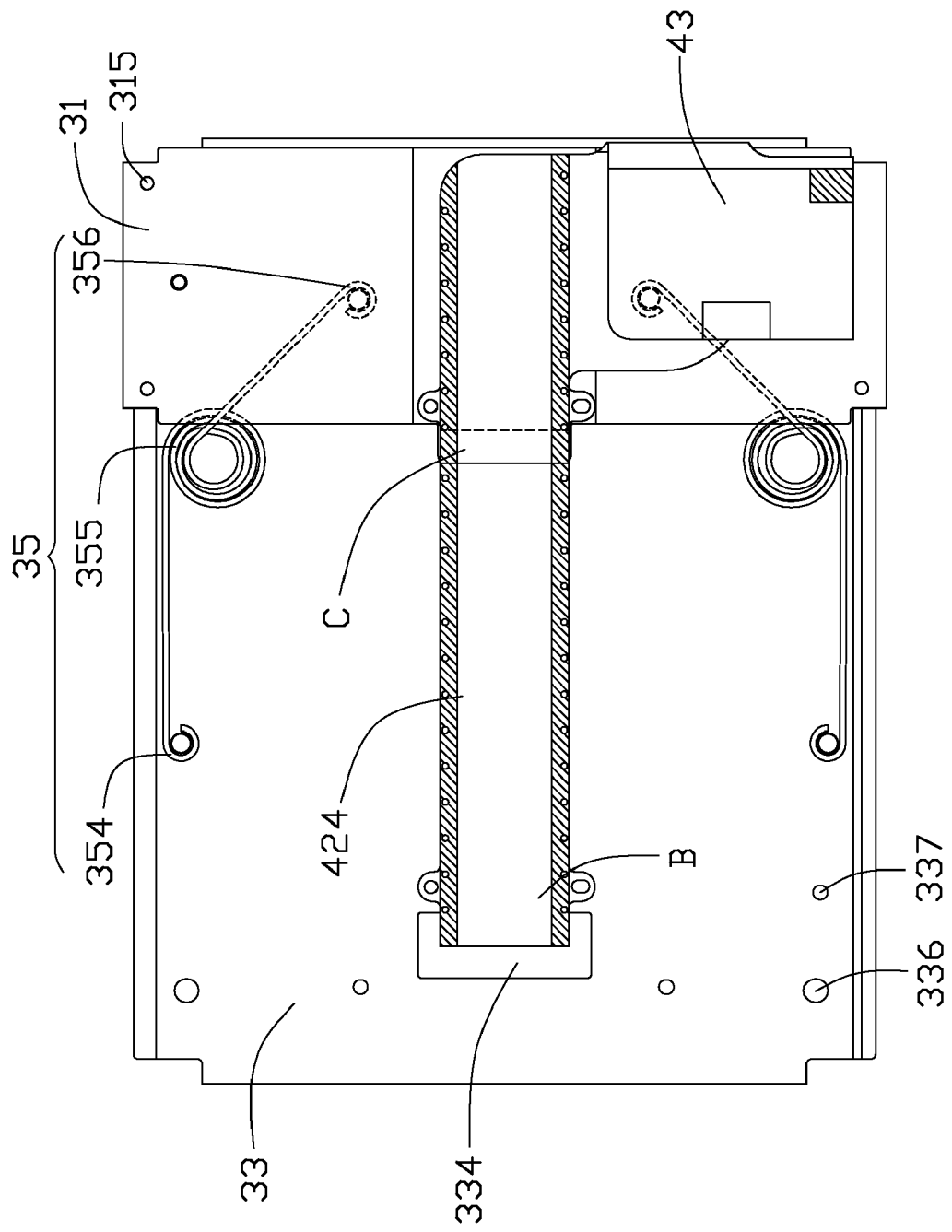
FIG. 11 is similar to FIG. 10, but shown in another visual angle.

Also referring to FIG. 10 and FIG. 11, the resilient members 35 are two coiled springs. Each resilient member 35 includes a first fixed end 354, a resilient portion 355 and a second fixed end 356. The first fixed ends 354 of the resilient members 35 are respectively mounted on two sides adjacent to the sliding rails 332 of the sliding member 33. The resilient portion 355 of each resilient member 35 is coiled approximately parallel to the sliding member 33. The second fixed ends 336 of the resilient members 35 are mounted on a surface of the static member 31 that faces the sliding member 33.

When the sliding mechanism 30 is assembled, each sliding rail 332 engages with a sliding groove 314 respectively, thus the sliding member 33 is movably mounted on the static member 31. In this way, the sliding member 33 is movably mounted on the static member 31 and able to slide along the sliding grooves 314. Additionally, for decreasing a friction between the static member 31 and the sliding member 33, a filling (not labeled) made of a material having a small frictional coefficient such as plastic can be filled into the sliding grooves 314 for the sliding rails 332 engaging with the sliding grooves 314.

Figure 8:
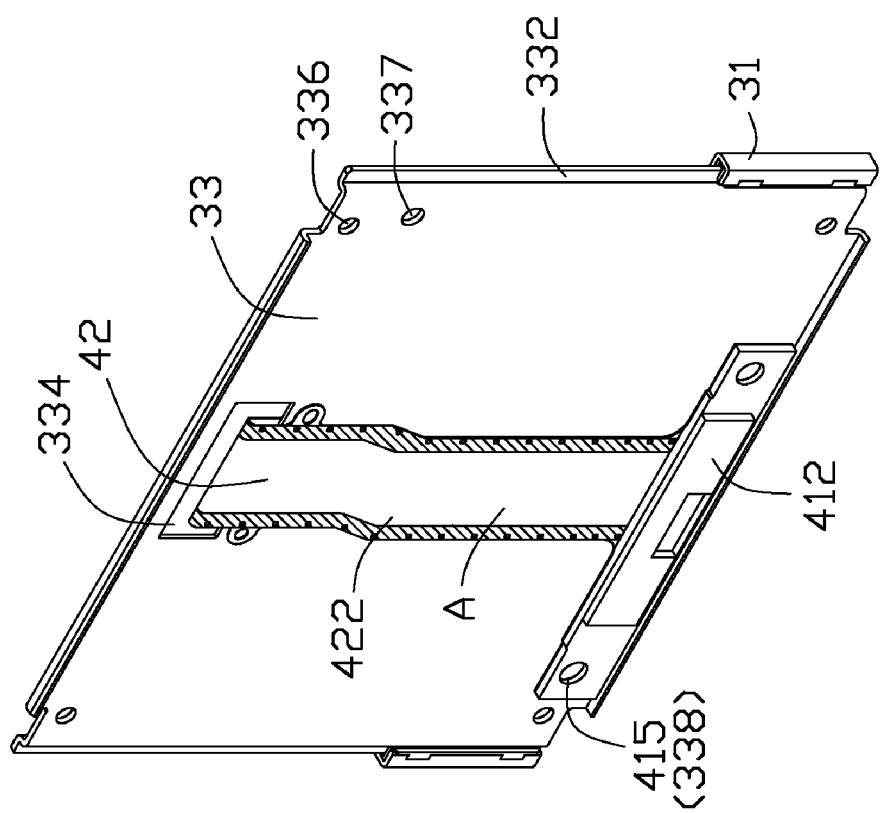
FIG. 8 is an enlarged, schematic view of a flexible printed circuit board of the portable electronic device shown in FIG. 2.
Figure 9:
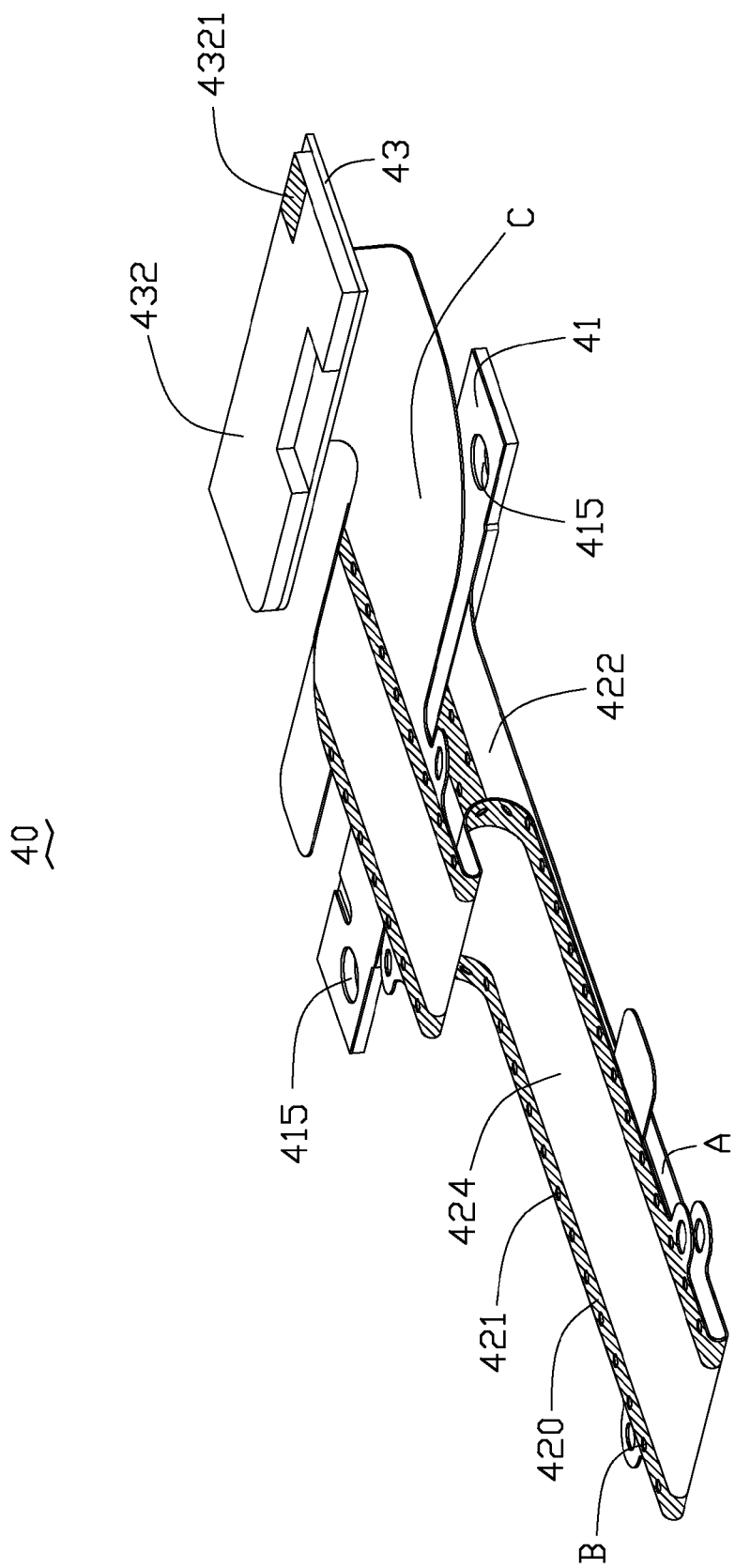
FIG. 9 is an assembled view of the sliding cover mechanism and the flexible printed circuit board shown in FIG. 2.

Also referring to FIG. 8 and FIG. 9, the flexible printed circuit board 40 has a rectangular shape, and a width thereof is less than that of the locating hole 334. The flexible printed circuit board 40 includes a first connecting portion 41, a main portion 42 and a second connecting portion 43. The first connecting portion 41 and the second connecting portion 43 are respectively connected to two ends of the main portion 42. A first connector 412 is formed on the first connecting portion 41, and a second connector 432 is formed on the second connecting portion 43. The second connector 432 has a grounding end 4321. A plurality of conducting holes 415 corresponding to the second mounting holes 338 are defined in the first connecting portion 41.

The main portion 42 includes an attached portion 422 and a detached portion 424. The attached portion 422 includes a first mounting section A and a locating section B, and the detached portion 424 includes a second mounting section C. The main portion 42 also defines a plurality of connecting apertures 421 running therethrough. A conductive layer 420, such as a silver layer or a copper layer, is then formed on both side surfaces of the main portion 42 and inside the connecting apertures 421 by means of plating or spreading. In this way, two parts of the conductive layer 420 which are respectively formed on both sides of the main portion 42 are electrically connected to each other via the connecting apertures 421. The first connector 412 and the grounding end 4321 of the second connector 432 are both electronically connected to the conductive layer 420.

Also referring to FIG. 1, FIG. 2 and FIG. 3, the base 50 is an approximately rectangular board. A circuit board (not shown) of the portable electronic device 100 having a grounding plane (not labeled) can be contained on the base 50. The second connector 432 is electrically connected to the circuit board, and the grounding end 4321 of the second connector 432 is electrically connected to the grounding plane of the circuit board. The base 50 defines a containing recess 52 corresponding to the static member 31. An installing recess 522 corresponding to the receiving portion 311 of the static member 31 is defined in a bottom of the containing recess 52, and a plurality of second screw holes 525 corresponding to the first screw holes 315 are defined adjacent to the installing recess 522.

Referring to FIG. 9 and FIG. 10, in assembly, the flexible printed circuit board 40 is assembled with the sliding mechanism 30, and the conducting holes 415 are aligned with their corresponding second mounting holes 338. The first mounting section A and the attached portion 422 are fixedly mounted on a surface against the static member 31 of the sliding member 33, thus the conductive layer 421 is electrically connected to the sliding mechanism 30. The locating section B first runs through the locating hole 334 and is then fixedly mounted on the surface facing the static portion 31 of the sliding member 33. The detached portion 424 is detachably mounted on the surface mounting the locating section B, and the detached portion 424 is connected to the attached portion 422 via the locating section B. The second mounting section C extends a distance away from the locating section B, and then retraces and is mounted on the surface facing the sliding member 33 of the mounting portion 312 of the static member 31, thus covers the mounting portion 312 and is mounted on the other surface of the mounting portion 312 and the receiving portion 311.

The sliding member 30 is then assembled with the cover 10 and the base 50. The second retaining holes 336 are aligned with their corresponding first retaining holes 17. The third holding hole 337 is aligned with the first holding hole 185. The second mounting holes 338 and the conducting holes 415 are aligned with their corresponding first mounting holes 112. Thus, the cover 10, the sliding member 30 and the flexible printed circuit board 40 are assembled together by metal bolts. In this way, the cover 10, the sliding member 30 and the flexible printed circuit board 40 can be electrically connected to each other via the metal bolts. The first connector 412 is electrically connected to a display 70 mounted on the cover 10 of the portable electronic device 100.

The static member 31 is contained in the containing recess 52 of the base 50. The receiving portion 311 is contained in the installing recess 522 of the base 50. The second connector 432 is electrically connected to a typical circuit board 60 including a grounding plane 61 of the portable electronic device 100, and the grounding end 4321 of the second connector 432 is electrically connected to the grounding plane 61 of the circuit board 60. The second screw holes 525 are aligned with their corresponding first screw holes 315, and electrically connected to the first screw holes 315 via metal bolts or soldering.

The conductive member 20 is mounted in the mounting recess 10 of the cover 10. The holding pole 186 is inserted into the inserting hole 221, and the installing end 22 is mounted in the mounting recess 18. The second holding hole 223 is aligned with the first holding hole 185 and the third holding hole 337. The second holding hole 223, the first holding hole 185 and the third holding hole 337 are electrically connected to others via metal bolts or soldering. The bent end 23 is blocked by the display 70, thus is electrically connected to the display 70.

Figure 12:
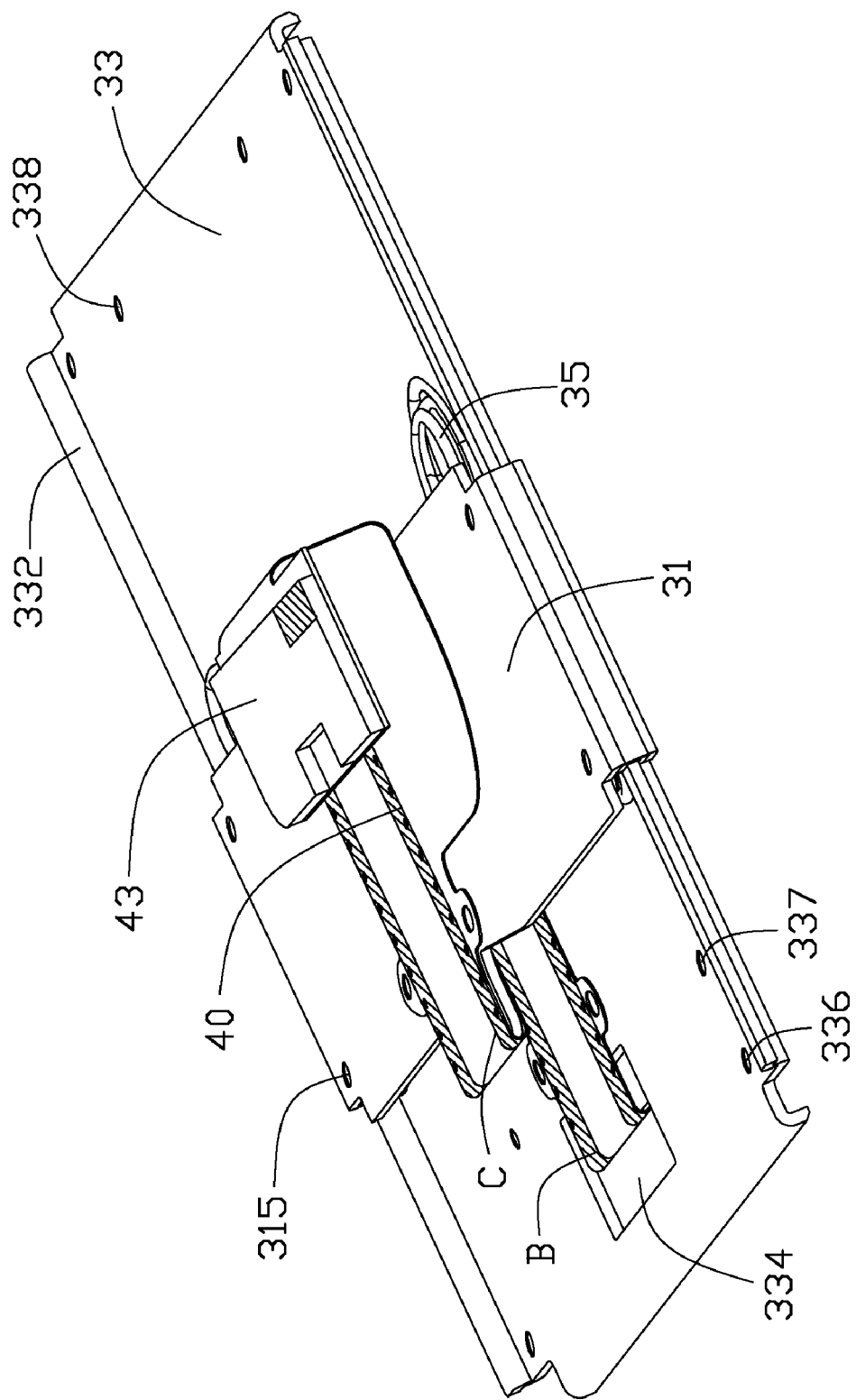
FIG. 12 is an opened, schematic view of the sliding cover mechanism and the flexible printed circuit board shown in FIG. 2.
Figure 13:
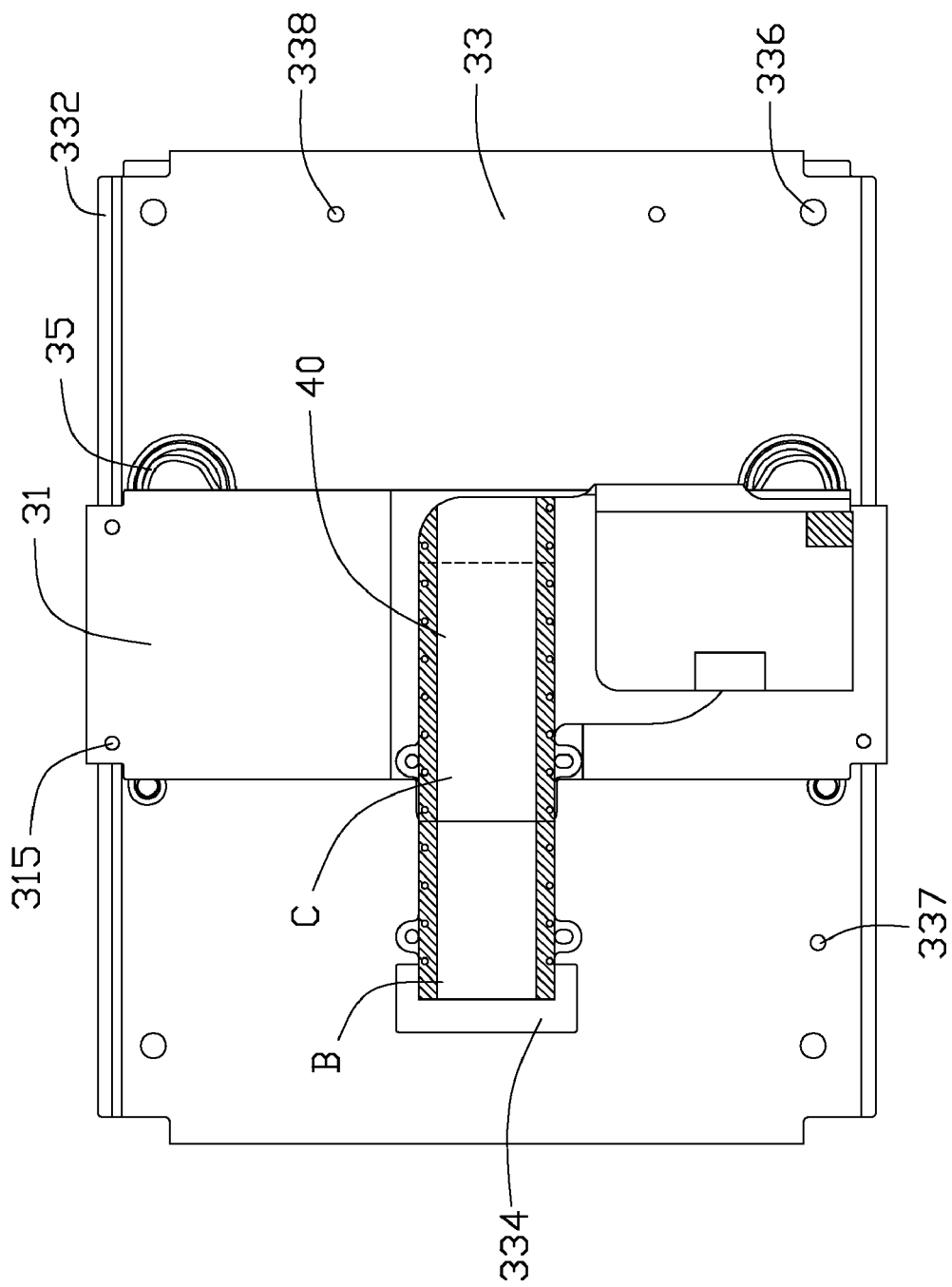
FIG. 13 is similar to FIG. 12, but shown in another visual angle.

Also referring to FIG. 11 to FIG. 13, in use, when the portable electronic device 100 is opened, the sliding member 33 slides along the sliding grooves 314, the resilient ends 356 of the resilient members 35 is bent and stores potential energy therein. When the cover 50 slides to a predetermined opened position, a typical retainer (not shown) mounted in the portable electronic device 100 retains the sliding member 33, thus the portable electronic device 100 can be used. When the portable electronic device 100 closes, the retainer is released, and the resilient ends 356 of the resilient members 35 release the stored potential energy and resume to initial shapes. Thus, the sliding member 33 and the cover 50 are driven to initial positions, which close the portable electronic device 100.

At the same time, the locating section B of the connector 42 moves towards the static member 33 and the second mounting section C. Thus, the second mounting section C leads the detached portion 424 to detach from the sliding member 33 and gradually enter the receiving portion 311 until most of the detached portion 424 is contained by the receiving portion 311. In this way, the connector 42 moves and transforms in a predetermined space, thus the connector 42 cannot block movement of the sliding member 33. Furthermore, the connector 42 is prevented from being scraped by the sliding member 33 at the sides of the through hole 334 since it is fixedly mounted on two sides of the through hole 334 (i.e., the first mounting section A and the locating section B).

In use, a high electrostatic discharge may be caused by the display 70 of the portable electronic device 100. However, when an instantaneous discharging occurs, the charge can transfer via the conductive member 20, the sliding mechanism 30, the conductive layer 420 of the flexible printed circuit board 40 and the second connector 432, and finally conducts via the grounding plane 61. In this way, the grounding apparatus 200 prevents the electrostatic charges from damaging the portable electronic device 100. Understandably, the grounding apparatus 200 provides enough channels including the conductive layer 421 and the sliding mechanism 30, thus the electrostatic discharges can reach the grounding plane 61 conveniently. For forming a larger conducting access, the cover 10 can define a plurality of mounting recesses 18, and a plurality of conductive members 20 electrically connected to the display 70 can be mounted in the mounting recesses 18.

It is to be further understood that even though numerous characteristics and advantages of the present embodiments have been set forth in the foregoing description, together with details of structures and functions of various embodiments, the disclosure is illustrative only, and changes may be made in detail, especially in matters of shape, size, and arrangement of parts within the principles of the present invention to the full extent indicated by the broad general meaning of the terms in which the appended claims are expressed.

What is claimed is:

1. A grounding apparatus, comprising:
   at least one conductive member;
   a sliding mechanism, the sliding mechanism being conductive and electrically connected to the conductive member; and
   a flexible printed circuit board, the flexible printed circuit board including a conductive layer and a grounding end, the conductive layer and the grounding end being electrically connected to the sliding mechanism.

2. The grounding apparatus as claimed in claim 1, wherein the flexible printed circuit board includes a main portion, the conductive layer being formed on both sides of the main portion.

3. The grounding apparatus as claimed in claim 2, wherein the main portion defines a plurality of connecting apertures running therethrough, and two parts of the conductive layer which are respectively formed on both sides of the main portion being electrically connected to each other via the connecting apertures.

4. The grounding apparatus as claimed in claim 3, wherein the flexible printed circuit board includes a first connecting portion connected to the main portion and defining a plurality of connecting holes therein, the sliding mechanism including a sliding member, and the first connecting portion is mounted to and electrically connected to the sliding member and the cover via the connecting holes.

5. The grounding apparatus as claimed in claim 4, wherein the flexible printed circuit board includes a second connecting portion connected to the main portion and the base, and the grounding end is formed on the second connecting portion.

6. The grounding apparatus as claimed in claim 1, wherein the conductive member is mounted on the cover and electrically connected to the sliding member.

7. The grounding apparatus as claimed in claim 1, wherein the cover includes a holding pole, and the conductive member defines an inserting hole corresponding to the holding pole; the holding pole being inserted into the inserting hole to mount the conductive member on the cover.

8. A portable electronic device, comprising:
   a cover,
   a display mounted on the cover;
   a base;
   a grounding plane; and
   a grounding apparatus, the grounding apparatus including at least one conductive member, a sliding mechanism, and a flexible printed circuit board; the conductive member being electrically connected to the display; the sliding mechanism being conductive, the cover being slidingly mounted on the base via the sliding mechanism, and the sliding mechanism being electrically connected to the conductive member; the flexible printed circuit board electrically connecting the display, the sliding mechanism and the grounding plane.

9. The portable electronic device as claimed in claim 8, wherein the flexible printed circuit board includes a main portion and a conductive layer formed on both sides of the main portion.

10. The portable electronic device as claimed in claim 9, wherein the main portion defines a plurality of connecting apertures running therethrough, and two parts of the conductive layer which are respectively formed on both sides of the main portion being electrically connected to each other via the connecting apertures.

11. The portable electronic device as claimed in claim 10, wherein the flexible printed circuit board includes a first connecting portion connected to the main portion and defining a plurality of connecting holes therein; the sliding mechanism including a sliding member, and the first connecting portion being mounted to and electrically connected to the sliding member and the cover via the connecting holes.

12. The portable electronic device as claimed in claim 11, wherein the flexible printed circuit board includes a second connecting portion and a grounding end, the second connecting portion being electrically connected to the main portion and the base, and the grounding end being formed on the second connecting portion.

13. The portable electronic device as claimed in claim 8, wherein the conductive member is mounted on the cover and electrically connected to the sliding member.

14. The portable electronic device as claimed in claim 13, wherein the cover includes a holding pole, the conductive member defining an inserting hole corresponding to the holding pole, the holding pole being inserted into the inserting hole to mount the conductive member on the cover.

* * * * *